(12) United States Patent
Tye et al.

(10) Patent No.: US 12,387,912 B2
(45) Date of Patent: Aug. 12, 2025

(54) SHIELD RING MOUNTING USING COMPLIANT HARDWARE

(71) Applicant: Applied Materials, Inc., Santa Clara, CA (US)

(72) Inventors: Jordan B. Tye, Arlington, MA (US); James A. Pixley, Dover, NH (US); John R. Fairhurst, Plaistow, NH (US)

(73) Assignee: Applied Materials, Inc., Santa Clara, CA (US)

( * ) Notice: Subject to any disclaimer, the term of this patent is extended or adjusted under 35 U.S.C. 154(b) by 256 days.

(21) Appl. No.: 18/218,825

(22) Filed: Jul. 6, 2023

(65) Prior Publication Data

US 2025/0014870 A1    Jan. 9, 2025

(51) Int. Cl.
  *H01J 37/32*  (2006.01)
  *H01J 37/317*  (2006.01)

(52) U.S. Cl.
  CPC .... *H01J 37/32513* (2013.01); *H01J 37/3171* (2013.01); *H01J 37/32651* (2013.01); *H01J 2237/3365* (2013.01)

(58) Field of Classification Search
  None
  See application file for complete search history.

(56) References Cited

U.S. PATENT DOCUMENTS

| | | | |
|---|---|---|---|
| 5,558,717 A * | 9/1996 | Zhao | H01L 21/68742 118/728 |
| 5,853,607 A * | 12/1998 | Zhao | H01L 21/68742 438/758 |
| 6,079,356 A * | 6/2000 | Umotoy | H01J 37/32449 118/728 |
| 6,123,804 A * | 9/2000 | Babassi | H01L 21/68721 118/728 |
| 6,219,219 B1 * | 4/2001 | Hausmann | H01L 21/6831 361/234 |

(Continued)

FOREIGN PATENT DOCUMENTS

| | | |
|---|---|---|
| JP | 2008-311298 A | 12/2008 |
| TW | 434669 B | 5/2001 |

(Continued)

OTHER PUBLICATIONS

International Search Report and Written Opinion mailed Oct. 2, 2024 in corresponding PCT application No. PCT/ US2024/033272.

*Primary Examiner* — Srinivas Sathiraju

(74) *Attorney, Agent, or Firm* — Nields, Lemack & Frame, LLC

(57) ABSTRACT

A system for mounting the shield ring to the pedestal in a plasma chamber is disclosed. The mounting system includes compliant hardware. A fastener with a compliant component, such as an O-ring, is first secured to the pedestal. The shield ring has a top surface, a bottom surface and walls extending downward from the inner and outer diameter of the shield ring. Bores are located on the bottom surface of the shield ring. The bores of the shield ring are aligned with the fasteners and the shield ring is then pressed down onto the fasteners. As the shield ring is being pressed down, the walls of the bores force the compliant hardware to yield. When in place, the compliant hardware supplies the requisite compression force to hold the shield ring in place. The compliant hardware may be implemented in various manners.

18 Claims, 8 Drawing Sheets

(56) References Cited

U.S. PATENT DOCUMENTS

| | | | |
|---|---|---|---|
| 9,508,561 B2 * | 11/2016 | Naik | H01L 21/67184 |
| 9,719,169 B2 * | 8/2017 | Mohn | C23C 16/463 |
| 10,163,609 B2 * | 12/2018 | Lin | H01J 37/32192 |
| 11,818,810 B2 * | 11/2023 | Kashyap | H01L 21/68735 |
| 2005/0133164 A1 | 6/2005 | Fischer et al. | |
| 2008/0220596 A1 * | 9/2008 | Olander | H01J 27/02 |
| | | | 257/E21.334 |
| 2015/0132929 A1 * | 5/2015 | Horigome | H01L 21/2225 |
| | | | 438/513 |
| 2015/0262869 A1 * | 9/2015 | Naik | H01L 21/32139 |
| | | | 438/643 |
| 2016/0363240 A1 | 12/2016 | Wagner et al. | |
| 2018/0012763 A1 * | 1/2018 | Ueda | H01L 21/02057 |
| 2018/0130659 A1 | 5/2018 | Salimian et al. | |
| 2018/0174807 A1 * | 6/2018 | Lin | H01L 21/265 |
| 2022/0246406 A1 | 8/2022 | Zhang et al. | |
| 2022/0312553 A1 * | 9/2022 | Kashyap | H01L 21/67126 |
| 2025/0014870 A1 * | 1/2025 | Tye | H01J 37/32651 |
| 2025/0079116 A1 * | 3/2025 | Carrell | H01J 37/3171 |

FOREIGN PATENT DOCUMENTS

| | | |
|---|---|---|
| TW | 452916 B | 9/2001 |
| TW | 202240649 A | 10/2022 |
| TW | 202303801 A | 1/2023 |
| WO | 2019/117969 A1 | 6/2019 |

* cited by examiner

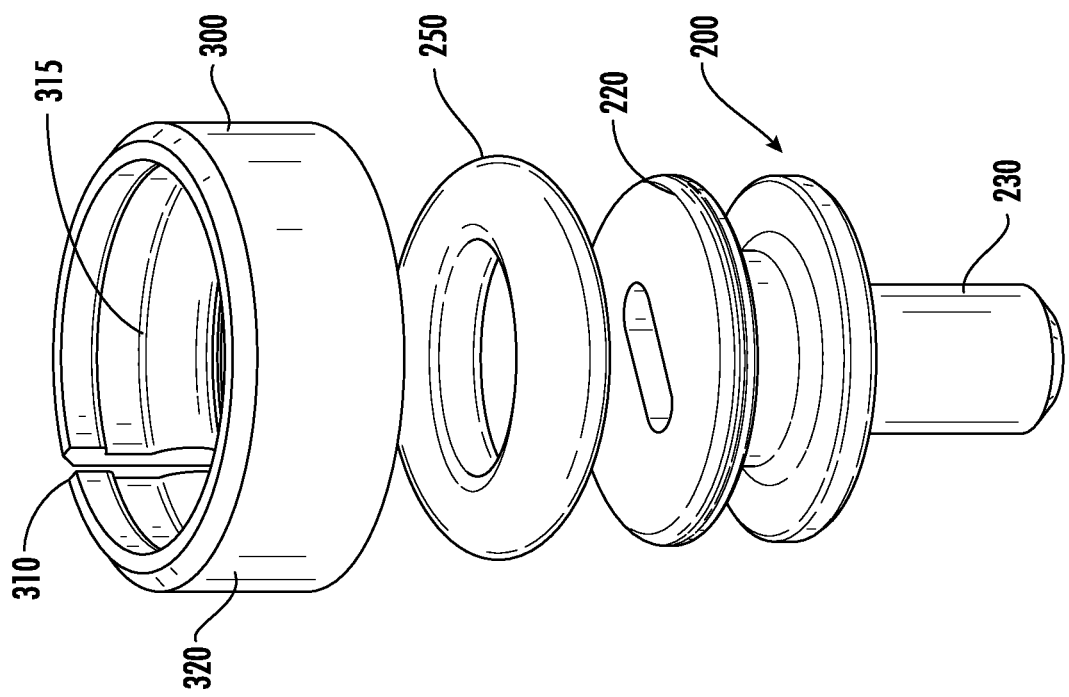
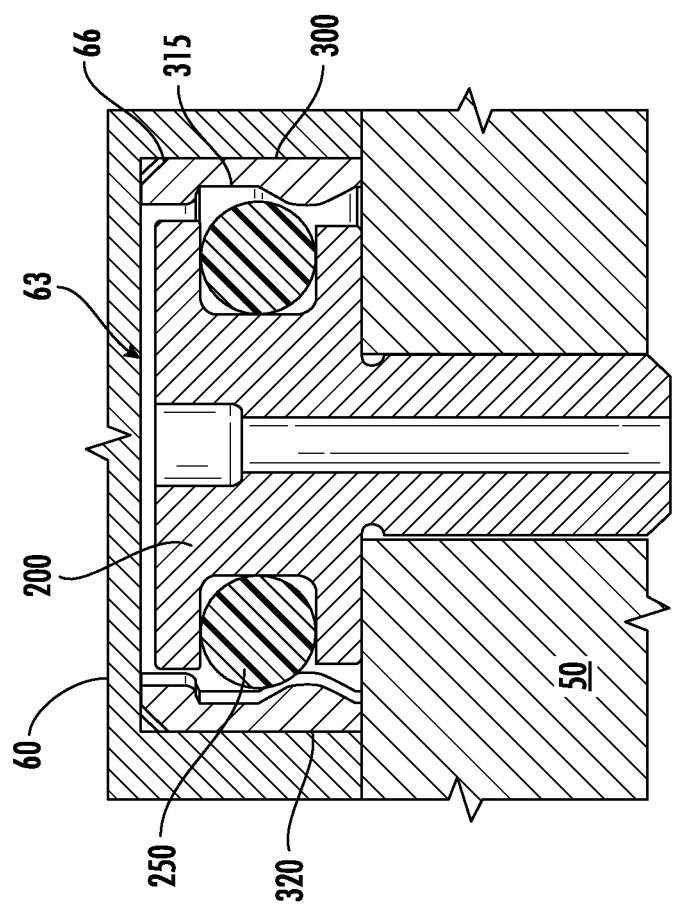
FIG. 5B
FIG. 5A

SHIELD RING MOUNTING USING COMPLIANT HARDWARE

FIELD

Embodiments of the present disclosure relate to a system for securing a shield ring in a plasma doping chamber.

BACKGROUND

Plasma doping systems (PLADS) are used to process semiconductor workpieces. An antenna is typically located along an exterior wall and is used to couple energy into the plasma chamber. In another embodiment, a coil antenna is located at the top of the plasma chamber and transfers RF energy through a vacuum break. A gas inlet supplies a feed gas to the plasma chamber. When energized, the antenna causes the feed gas to ionize into a plasma. The interior of the plasma chamber also includes a pedestal, or base. A platen is disposed on the pedestal, and is used to hold the workpiece in place. The platen may be biased to attract the ions from the plasma toward the workpiece. If the bias voltage is sufficiently great, the ions will be implanted into the workpiece. In other embodiments, a lower bias voltage is used to simply deposit the ions on the surface of the workpiece.

Additionally, components, such as ring electrodes may also be disposed in the pedestal, and are located outside the platen. The ring electrode may be biased to maintain a uniform plasma sheathe along the surface of the workpiece. To protect the ring electrode and other components from ion strike, a shield ring may be secured on top of the ring electrode. The shield ring may be silicon or silicon carbide with specific crystal structures and electrical conductivity.

Traditionally, the shield ring is placed above the ring electrode, and screws are used to hold the shield ring in place. Specifically, the shield ring is bolted to the pedestal using a plurality of through hole connections. Caps are then placed over the screws so that the screws are not impacted by the ions. Over time, the caps may loosen and become displaced. This may result in the screws being impacted by ions, causing contamination. Additionally, the cap creates crevices that can trap particles or deposition and may cause process non-uniformity.

Therefore, it would be beneficial if there was a system for securing the shield ring that did not rely on screws to secure the shield ring to the base, and also did not rely on caps to protect those screws. Further, it would be advantageous if there were no exposed metal components.

SUMMARY

A system for mounting the shield ring to the pedestal in a plasma chamber is disclosed. The mounting system includes compliant hardware. A fastener with a compliant component, such as an O-ring, is first secured to the pedestal. The shield ring has a top surface, a bottom surface and walls extending downward from the inner and outer diameter of the shield ring. Bores are located on the bottom surface of the shield ring. The bores of the shield ring are aligned with the fasteners and the shield ring is then pressed down onto the fasteners. As the shield ring is being pressed down, the walls of the bores force the compliant hardware to yield. When in place, the compliant hardware supplies the requisite compression force to hold the shield ring in place. The compliant hardware may be implemented in various manners.

According to one embodiment, a plasma doping system is disclosed. The plasma doping system comprises a plasma chamber; a pedestal disposed in the plasma chamber having a plurality of holes; a platen disposed on the pedestal; a shield ring surrounding the platen, wherein a bottom surface of the shield ring comprises a plurality of bores; and a plurality of fasteners, each secured to a respective one of the plurality of holes in the pedestal and each including a compliant component; wherein each of the plurality of fasteners is disposed within a respective one of the plurality of bores in the shield ring. In some embodiments, the compliant component is electrically conductive. In some embodiments, the compliant component is in contact with the shield ring. In some embodiments, the plurality of fasteners each comprises a head and a shaft, and wherein the head comprises a radial recess, and wherein the compliant component is disposed in the radial recess. In certain embodiments, the compliant component is an O-ring or a spiral wound shield gasket. In some embodiments, the plasma doping system includes a shield ring insert disposed in a respective one of the plurality of bores, wherein an outer surface of the shield ring insert is in contact with interior walls of the respective one of the plurality of bores and wherein the compliant component is in contact with an inner surface of the shield ring insert. In some embodiments, the plurality of fasteners each comprises a head and a shaft, and wherein an outer surface of the shaft is threaded and wherein the plurality of holes in the pedestal are threaded. In some embodiments, interior walls of the plurality of bores are smooth. In some embodiments, interior walls of the plurality of bores comprise an indentation that corresponds to a location of the compliant component. In some embodiments, the compliant component comprises sheet metal comprising a plurality of spokes, wherein each spoke is bent at at least one joint. In some embodiments, each bore is formed with an indentation such that a diameter of the bore at a bottom surface is smaller than a diameter of the bore at at least one other location.

According to another embodiment, an assembly for use on a pedestal in a plasma doping chamber is disclosed. The assembly comprises a shield ring shaped as an annular ring, wherein a bottom surface of the shield ring comprises a plurality of bores; and a plurality of fasteners, each having a head and a shaft, wherein the shaft is adapted to be secured to the pedestal, and wherein the head is configured to hold a compliant component; wherein each of the plurality of fasteners is disposed within a respective one of the plurality of bores in the shield ring, such that each compliant component is compressed in a respective one of the plurality of bores. In some embodiments, the head comprises a radial recess and the compliant component is disposed in the radial recess. In certain embodiments, the compliant component is an O-ring or a spiral wound shield gasket. In some embodiments, the compliant component is in contact with interior walls of the respective one of the plurality of bores. In some embodiments, the assembly includes a shield ring insert disposed in a respective one of the plurality of bores, wherein an outer surface of the shield ring insert is in contact with interior walls of the respective one of the plurality of bores and wherein the compliant component is in contact with an inner surface of the shield ring insert. In some embodiments, the compliant component comprises sheet metal comprising a plurality of spokes, wherein each spoke is bent at at least one joint. In some embodiments, each bore is formed with an indentation such that a diameter of the bore at a bottom surface is smaller than a diameter of the bore at at least one other location.

BRIEF DESCRIPTION OF THE FIGURES

For a better understanding of the present disclosure, reference is made to the accompanying drawings, which are incorporated herein by reference and in which:

FIGS. 5A-5B show a cross-sectional view and a perspective view of the mounting hardware according to another embodiment.

DETAILED DESCRIPTION

As described above, the present disclosure discloses a system for securing a shield ring in a plasma chamber.

Figure 1:
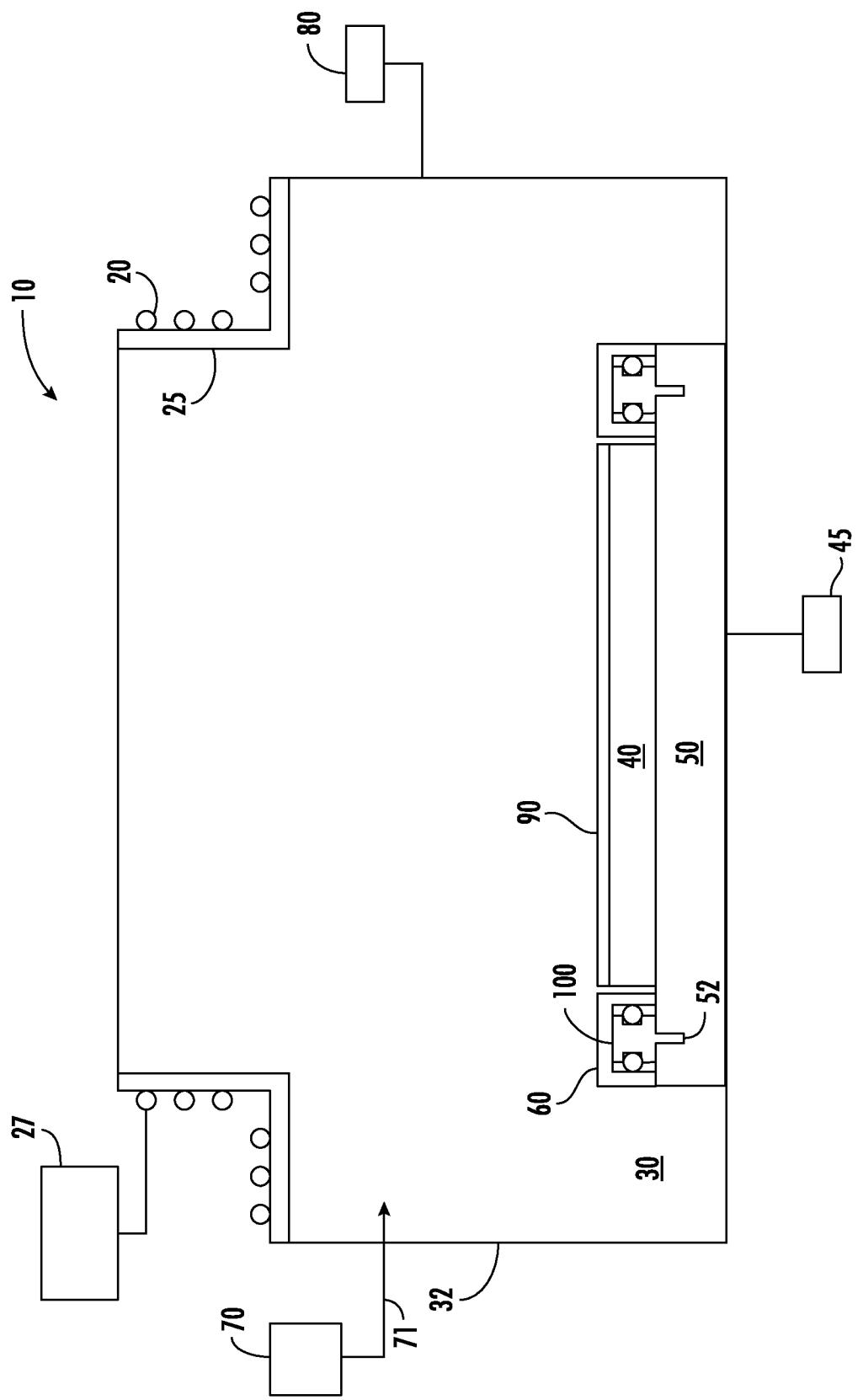
FIG. 1 is a plasma chamber in accordance with one embodiment.

FIG. 1 shows a PLAD (plasma doping) system 10. The PLAD system 10 comprises a plasma chamber 30, which is defined by a plurality of chamber walls 32.

An antenna 20 is disposed external to the plasma chamber 30, proximate a dielectric window 25. The dielectric window 25 may also form part of one or more of the walls that define the plasma chamber 30. The antenna 20 is electrically connected to a RF power supply 27, which supplies an alternating voltage to the antenna 20. The voltage may be at a frequency of, for example, 2 MHz or more. While the dielectric window 25 and antenna 20 are shown on part of chamber walls 32 and a top wall of the plasma chamber 30, other embodiments are also possible. For example, the antenna 20 may also be disposed on the top of the plasma chamber 30. For example, a coil antenna may be located at the top of the plasma chamber 30 and transfer RF energy into the plasma chamber 30 through a vacuum break. The chamber walls 32 of the plasma chamber 30 may be made of a conductive material, such as graphite, silicon, silicon carbide, aluminum, or another suitable material. These chamber walls 32 may be biased at an extraction voltage, such as by extraction power supply 80. The extraction voltage may be, for example, 1 kV, although other voltages are within the scope of the disclosure. In certain embodiments, an extraction power supply 80 may not be used and the chamber walls 32 may be electrically connected to ground.

This plasma chamber 30 may be supplied with a feed gas, which is contained in a feed gas source 70, via a feed gas inlet 71.

The PLAD system 10 includes a platen 40 disposed within the plasma chamber 30. The platen 40 may rest on a pedestal 50 and may be in electrical communication with a bias power supply 45. A workpiece 90 may be disposed on the top surface of the platen 40. The workpiece 90 may be a semiconductor wafer, such as a silicon wafer, a SiC wafer or another suitable wafer. The bias power supply 45 may be used to bias the platen 40 to a bias voltage which is more negative than the voltage of the plasma. This bias voltage attracts positive ions from the plasma toward the workpiece 90. The magnitude of the bias voltage applied by the bias power supply 45 may determine the energy at which these positive ions strike the workpiece 90. In certain embodiments, the magnitude of the bias voltage may be used to determine the rate of processing, such as the etch rate. The magnitude of the bias voltage may also be used to determine the depth of an implantation process. In certain embodiments, the bias voltage supplied by the bias power supply 45 may be a pulsed waveform, such as a square wave. In these embodiments, the workpiece 90 may be processed when the bias voltage is negative, but not processed when the bias voltage is ground or positive. The frequency of the square wave may vary, and may be between 0.1 kHz and 2 MHz. Although a square wave may be used, it is understood that the duty cycle of the pulsed waveform does not have to be 50%. Rather, any duty cycle may be used. In certain embodiments, the bias voltage is applied in the form of a pulsed DC waveform. This pulsed DC waveform may have any frequency, such as between 1 kHz and 1 MHz. Further, the duty cycle is not limited by this disclosure.

A shield ring 60 may be disposed along the outer edge of the workpiece 90. In certain embodiments, the workpiece 90 is round, and the shield ring 60 is constructed as an annular ring. The shield ring 60 may be constructed of a dielectric material, a ceramic material or a semiconductor material, such as for example, silicon or silicon carbide (Sic). Other materials that do not contaminate the workpiece may also be used. In some embodiments, the shield ring 60 may be a few millimeters in thickness and have a width of several centimeters. Although the shield ring 60 is much thicker than the workpiece 90, it may be disposed on the pedestal 50 such that the top surfaces of the workpiece 90 and the shield ring 60 are aligned. The shield ring 60 includes a top surface, which may be in the shape of an annular ring. Additionally, the shield ring 60 includes walls extending downward from the inner diameter and outer diameter of the top surface.

Located beneath the shield ring 60 is the mounting hardware 100. The mounting hardware 100 includes at least one compliant component, such as an O-ring, which is used to provide the compression force to hold the shield ring 60 in place. During installation, the mounting hardware 100 is first secured to the pedestal 50. In certain embodiments, the pedestal 50 includes a plurality of holes 52. In some embodiments, the mounting hardware 100 includes corresponding shafts, which are pressed into the holes 52. In certain embodiments, these holes 52 may be threaded. In these embodiments, the mounting hardware 100 includes threaded shafts which are screwed into corresponding threaded holes in the pedestal 50. The shield ring 60 is then pressed onto the mounting hardware 100. Since the mounting hardware 100 includes compliant components, the mounting hardware conforms to the shield ring 60. In this way, there are no exposed fasteners.

Figure 2A:
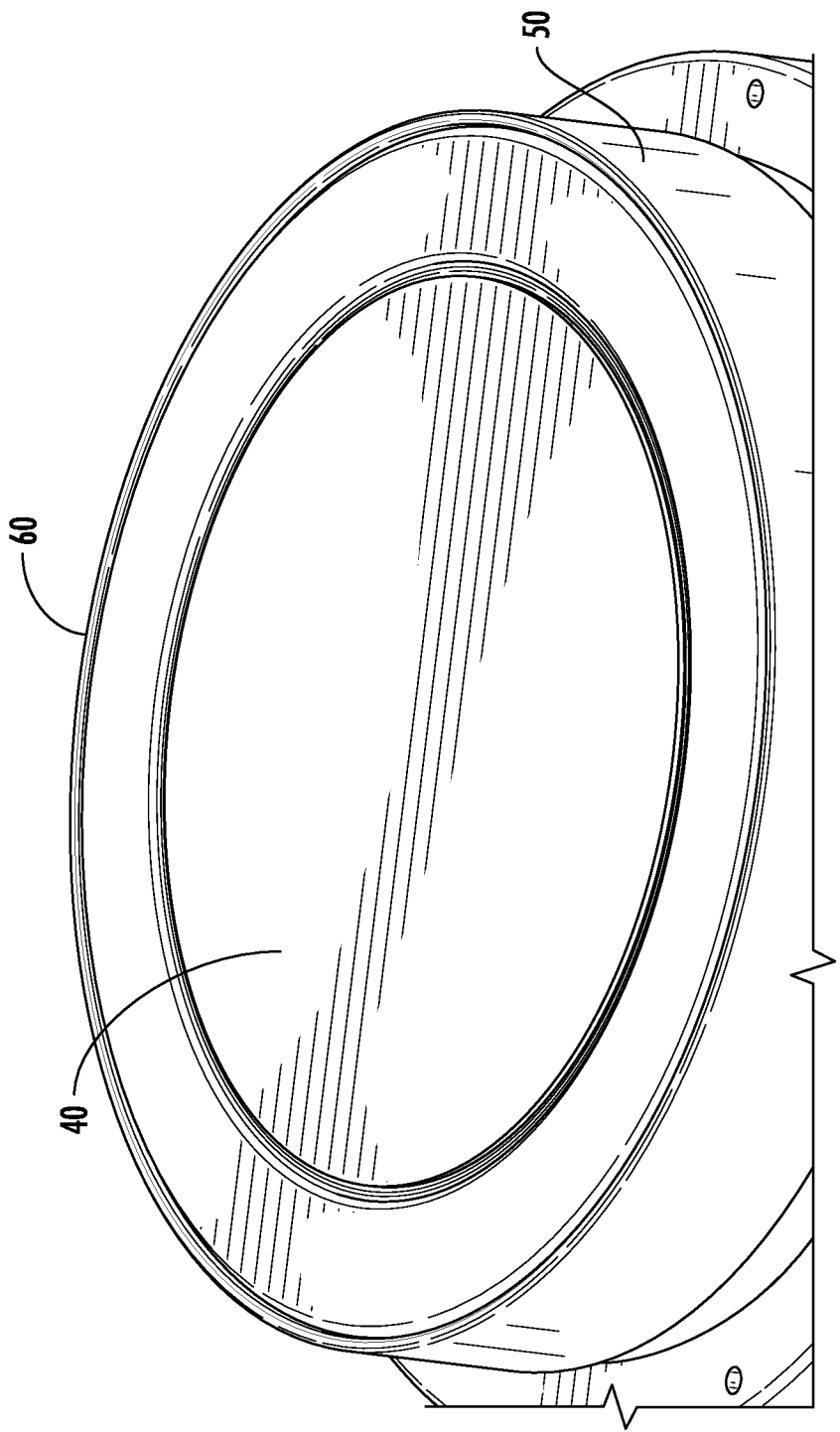
FIG. 2A-2C show a shield ring that may be used with the plasma chamber according to one embodiment.

In each of these embodiments, there is a shield ring 60. FIG. 2A shows the shield ring 60 mounted on the pedestal in the plasma chamber 30. FIG. 2B is a top view of the shield ring 60, while FIG. 2C is a zoomed view of the bottom surface of the shield ring 60.

As shown in FIG. 2A, the shield ring 60 is mounted on the pedestal 50 and is shaped as an annular ring, which surrounds the platen 40. The shield ring 60 has a height, which may be, for example between 0.125 and 0.50 inches. The width of the shield ring 60, which is the difference between the outer radius and the inner radius may be between 1 and 3 inches.

Figure 2C:
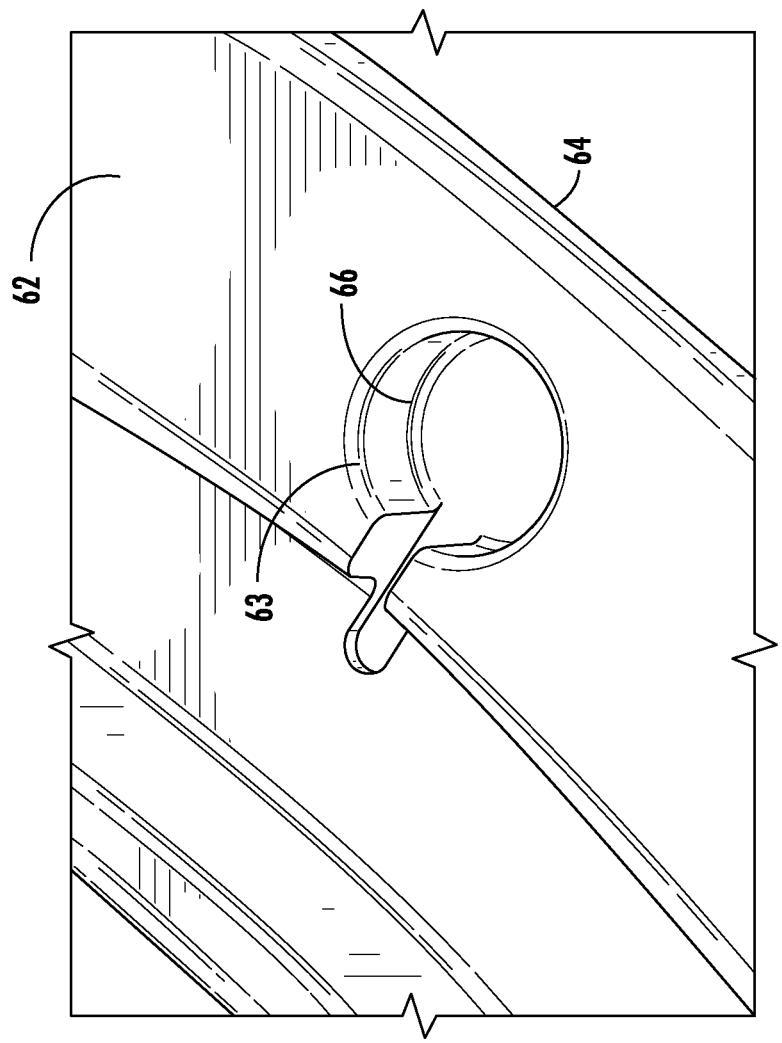
Figure 2B:
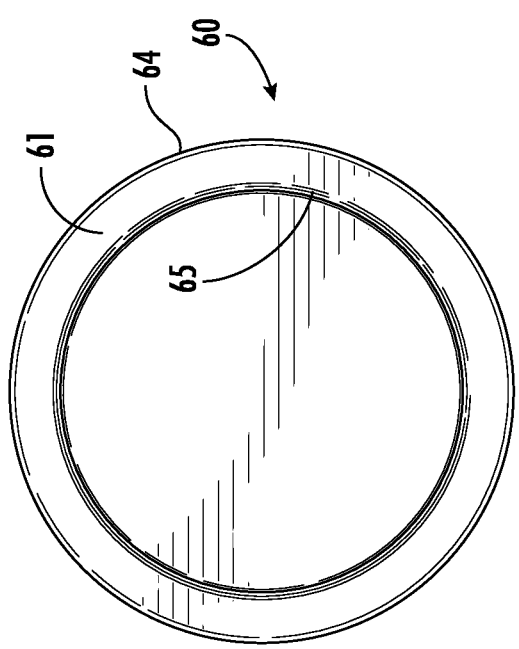

As seen in FIGS. 2B-2C, the shield ring 60 has a top surface 61, which is flat with few or no openings. In certain embodiments, holes may exist on the top surface 61 to allow the placement of current sensors, such as Faraday sensors under the shield ring 60. The shield ring 60 also has a bottom surface 62. The bottom surface 62 of the shield ring 60 has a plurality of bores 63. Each bore 63 is positioned so as to align with the holes 52 in the pedestal 50. Note that while FIG. 2C shows a slot extending from the bore 63, in other embodiments, this slot is not present.

An outer wall 64 extends from the top surface 61 to the bottom surface 62 along the outer circumference. An inner wall 65 extends from the top surface 61 to the bottom surface 62 along the inner circumference. Further, the bores 63 define interior walls 66 which interface with the mounting hardware 100.

As noted above, the mounting hardware 100 may take various forms. The mounting hardware may include a fastener 200 which is secured to the pedestal 50.

Figure 3:
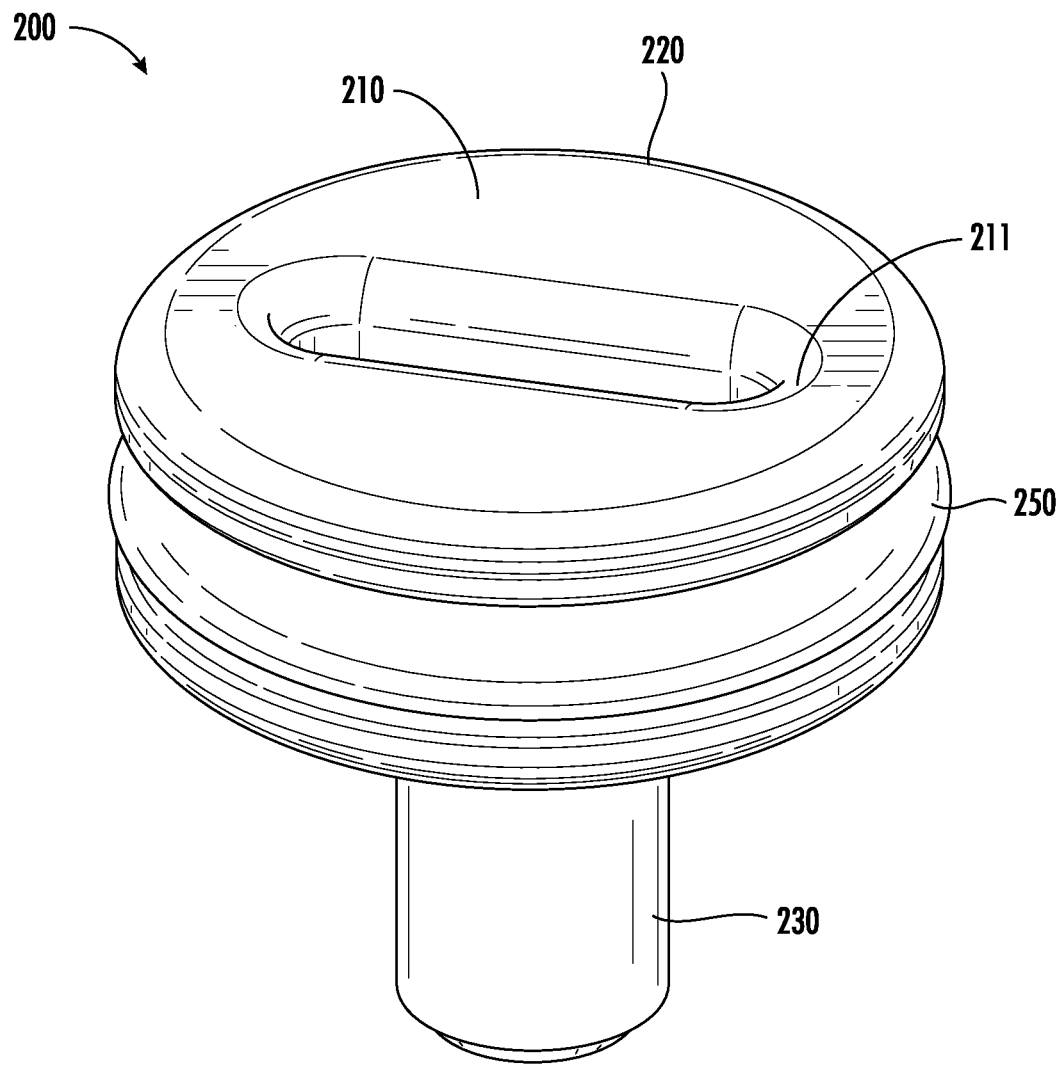
FIG. 3 shows the fastener that may be used according to one embodiment.
Figure 4A:
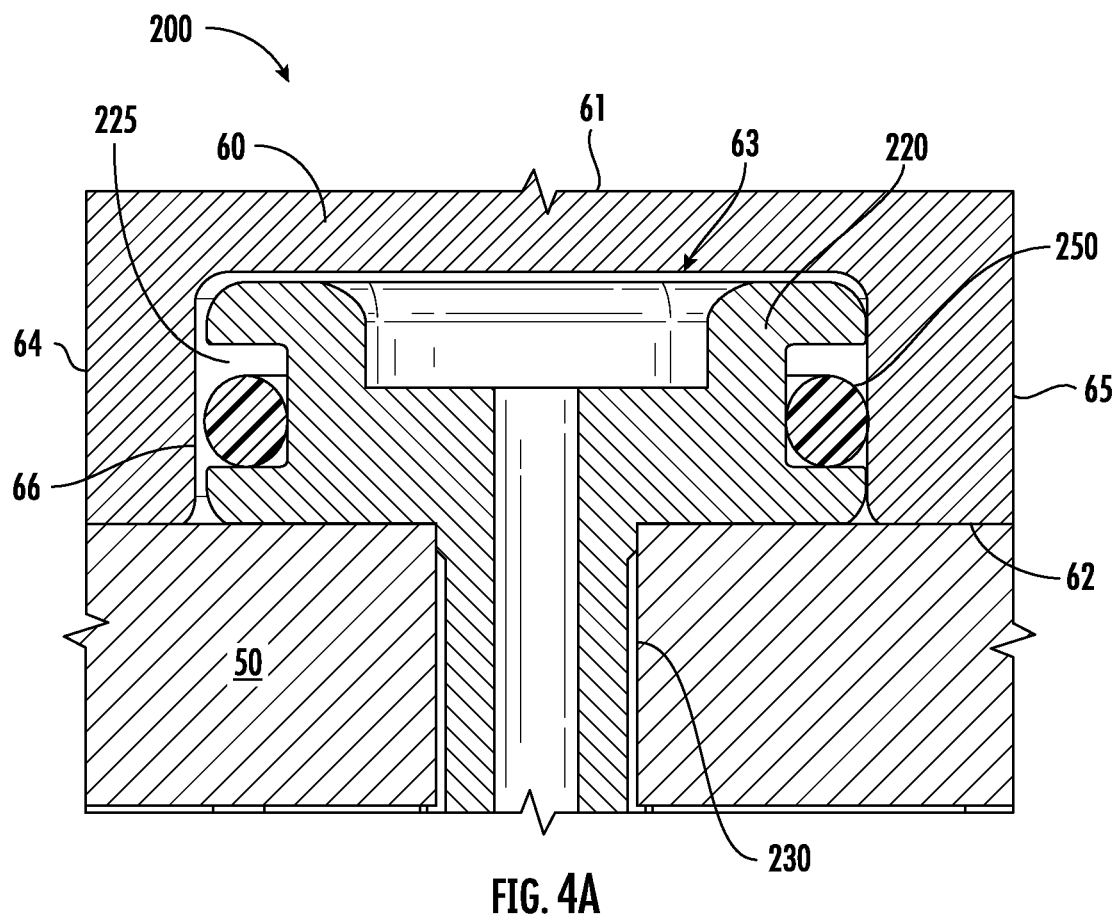
FIGS. 4A-4B show cross-sectional view of the mounting hardware using the fastener of FIG. 3 using two different shield rings.

FIG. 3 shows the fastener 200 according to one embodiment. The fastener 200 may be constructed from a suitable metal, such as aluminum or stainless steel. The fastener 200 includes a head 220 having a top surface 210, which may include a slot 211 into which a screwdriver may be placed to tighten the fastener 200 to the pedestal 50. In some embodiments, the slot 211 may extend through the length of the fastener 200 so as to allow access to the interior of the hole 52 of the pedestal 50. This may be to allow air to be exhausted from the PLAD system 10. The fastener 200 also includes a shaft 230 extending downward from the head 220. As noted above, the interior of the shaft 230 may be hollow. Further, although not shown, in some embodiments, where the holes 52 in the pedestal 50 are threaded, the outer surface of the shaft 230 may be threaded. The head 220 of the fastener 200 includes a radial recess 225 (see FIGS. 4A-4B). The radial recess 225 may be dimensioned such that its depth in the radial direction is less than its height. While FIG. 4A shows the radial recess 225 as being rectangular in cross-section, other groove shapes are also possible. For example, the cross-section of the radial recess 225 may be semi-circular, trapezoidal or another shape.

In this way, an O-ring 250 may be disposed in the radial recess 225 and extend outward beyond the outer diameter of the head 220. The O-ring 250 may be made from an electrically conductive material, such as silicone or one or more polymers. The polymers used may include silicone, fluorosilicone, EPDM, or other fluorocarbons. These polymers have fillers such as nickel, aluminum, silver, copper, graphite, or carbon to increase their electrical conductivity. The outer diameter of the O-ring 250 is slightly larger than that of the head 220 of the fastener 200. This allows the O-ring 250 to comply and create an interference fit. Cross sections of the O-ring 250 may range from 0.03 inches to more than 0.2 inches.

In another embodiment, the compliant component may not be silicone. Rather, the O-ring 250 may be replaced with a spiral wound shield gasket. These gaskets are constructed from a thin piece of metal and are wound and formed into an annular shape. In some embodiments, the thin piece of metal is wound around a cord or a polymer ring.

The term "compliant component" is used to denote the embodiments disclosed herein and any equivalents.

Figure 4B:
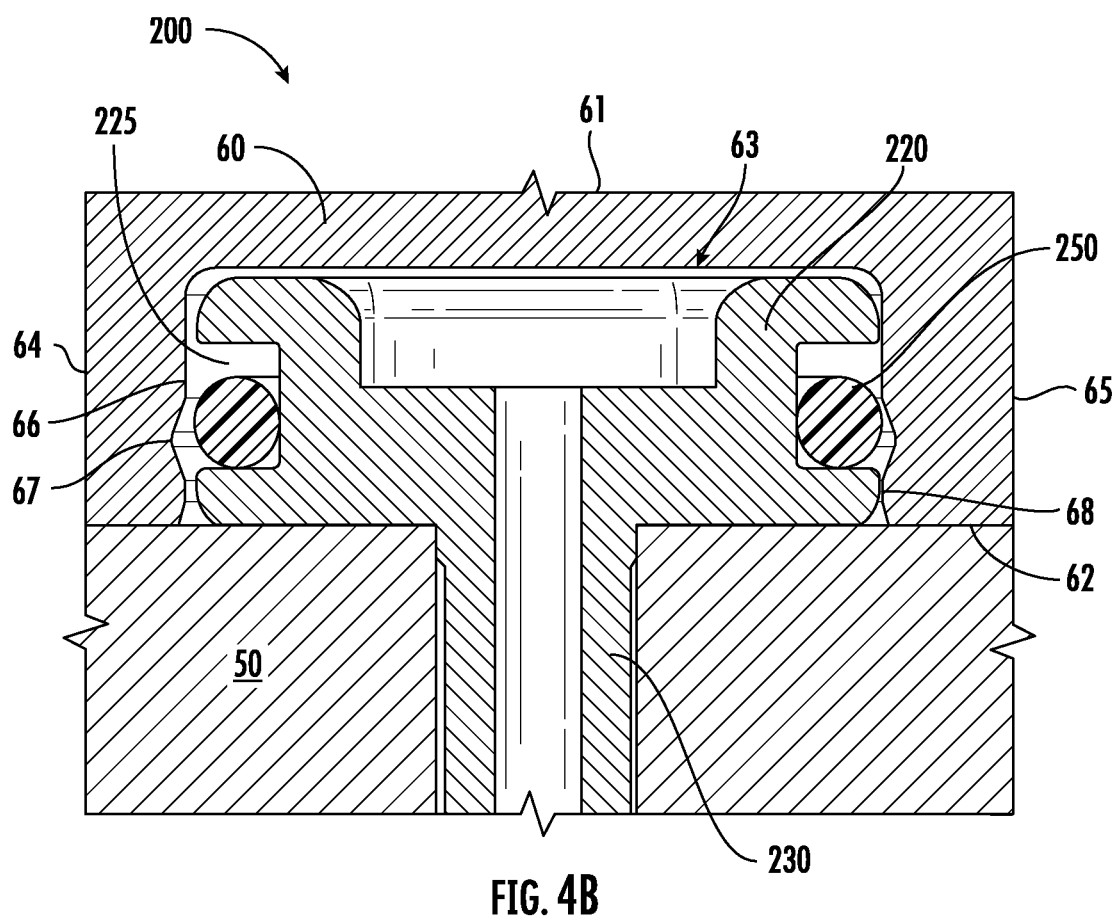

FIGS. 4A and 4B show two embodiments that utilize the fastener 200 of FIG. 3. Each is a cross sectional view of the shield ring 60 mounted on the fastener 200.

In FIG. 4A, the interior walls 66 of the bores 63 of the shield ring 60 are smooth. During installation, the fastener 200 is pressed or screwed into a hole 52 in the pedestal 50. The O-ring 250 is placed in the radial recess 225. This may be performed prior to or after the fastener 200 is attached to the pedestal 50. The shield ring 60 is then pressed onto the fastener 200, wherein the bores 63 are aligned with the fasteners 200. Since the O-ring 250 is compliant, it compresses to allow the shield ring 60 to be pressed into place. Thereafter, the compression force and friction due to the O-ring 250 against the interior walls 66 holds the shield ring 60 in place.

The embodiment of FIG. 4A relies on friction to retain the shield ring 60 in place. However, it is also possible to add an additional feature to more positively engage with the compliant component. FIG. 4B shows another embodiment of the shield ring 60 that may be utilized with the fastener 200. In this embodiment, the interior walls 66 of the bores 63 of the shield ring 60 are contoured. Specifically, there is an indentation 67 in the interior wall 66. In other words, the diameter of the bore is smaller at the bottom surface 62 than at a location between the top surface 61 and the bottom surface 62. Furthermore, the interior wall 66 may be designed such that the indentation 67 is aligned with the location of the O-ring 250. In another embodiment, the interior wall 66 may be designed as a stepped wall, wherein the diameter of the bore is smaller at the bottom surface 62 than at a location above the bottom surface 62. Thus, in these embodiments, the interior wall 66 includes an inward protrusion 68 at the bottom surface 62. The mounting hardware is assembled in the same manner as described with respect to FIG. 4A. However, in this embodiment, in addition to the compression force and friction due to the O-ring 250, the shield ring 60 is also held in place due to the inward protrusion 68 on the interior wall 66 of the bore 63.

In FIGS. 4A-4B, the shield ring 60 is configured to contact the O-ring 250. In this way, electrical and thermal conductivity exists between the shield ring 60, the fastener 200 and the pedestal 50.

However, other configurations are also possible. FIGS. 5A-5B utilizes the shield ring 60 described in FIG. 4A, which has smooth interior walls 66. Additionally, FIGS. 5A-5B utilizes the fastener 200 described with respect to FIG. 3. FIG. 5A shows a cross-sectional view of the mounting hardware installed on the pedestal 50, while FIG. 5B shows a perspective view of the fastener 200 and the shield ring insert 300.

In this embodiment, a shield ring insert 300 is disposed in the bore 63 of the shield ring 60. The shield ring insert 300 may be a metal component, such as aluminum or stainless steel, which is shaped as a hollow cylinder. Further, in other embodiments, the shield ring insert 300 may not be a closed cylinder. Rather, a slit 310 may extend along the height of the shield ring insert 300. This slit 310 allows the shield ring insert 300 to be more compliant. In other embodiments, the shield ring insert 300 is a hollow cylinder. The shield ring insert 300 has an inner surface 315, which faces the fastener 200. The shield ring insert 300 also has an outer surface 320 which faces the interior walls 66 of the bore 63. In some embodiments, the outer surface 320 is smooth, and friction is used to hold the shield ring insert 300 in the bore 63. In other embodiments, there may be knurling or another raised pattern on the outer surface 320. This raised pattern serves to increase the friction between the shield ring insert 300 and the interior walls 66 of the bore 63.

The inner surface 315 of the shield ring insert 300 may be shaped like the interior walls 66 described in FIG. 4B. Thus, in this embodiment, the inner surface 315 is contoured. Specifically, there is an indentation in the inner surface 315 such that the diameter of the shield ring insert 300 is smaller at the bottom surface of the bore 63 than at a location between the top surface 61 and the bottom surface 62. Furthermore, the inner surface 315 may be designed such that the indentation is aligned with the O-ring 250. In another embodiment, the inner surface 315 may be designed as a stepped wall, wherein the diameter of the shield ring insert 300 is smaller at the bottom surface 62 of the bore than at a location above the bottom surface 62. Thus, in these embodiments, the inner surface 315 includes an inward protrusion near the bottom surface 62 of the bore.

During installation, the shield ring insert 300 is pressed into the bore 63 on the shield ring 60. The fastener 200 is secured to the pedestal 50. The O-ring 250 is placed in the radial recess 225. This may be done before or after the fastener 200 is secured to the pedestal 50. The shield ring 60 is then aligned with the fasteners 200 and pressed down. The O-ring 250 and the shield ring insert 300 are both compliant, so there may be relative movement between these components as the shield ring 60 is pressed into position.

Since the shield ring insert 300 is electrically and thermally conductive, conductivity between the shield ring 60, the fastener 200 and the pedestal 50 is maintained.

Figure 6A:
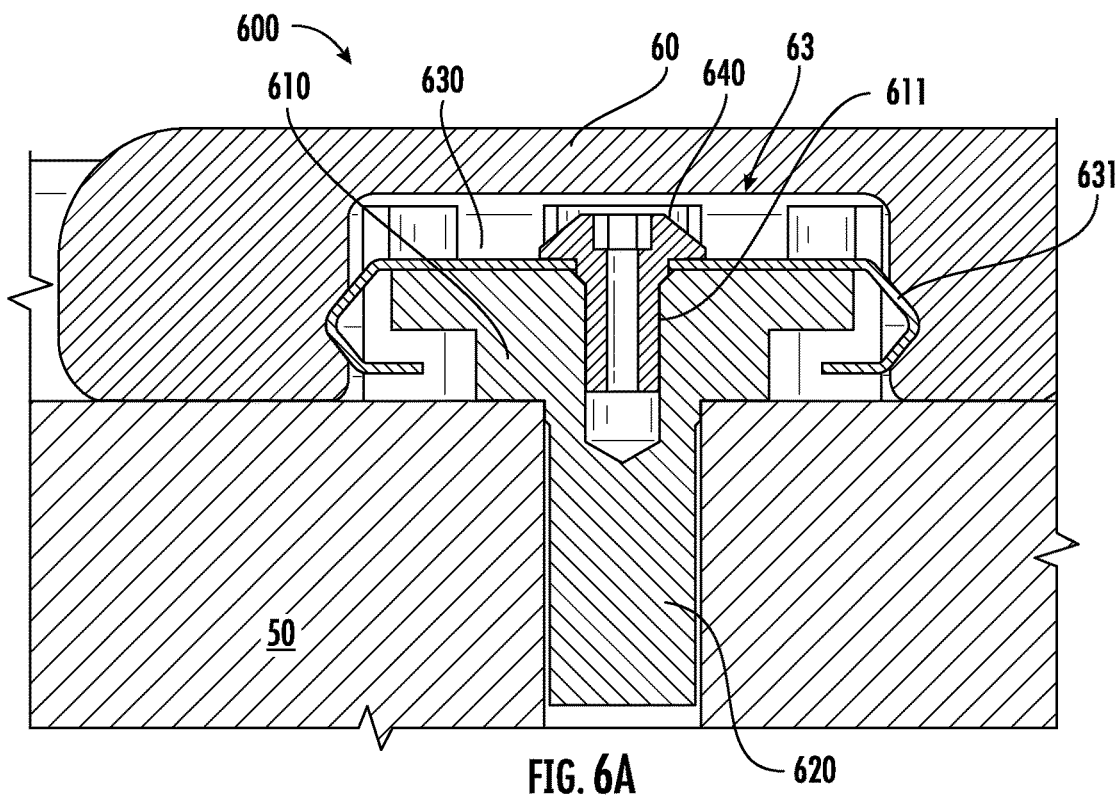
FIGS. 6A-6B show a cross-sectional view and a perspective view of the mounting hardware according to another embodiment.
Figure 6B:
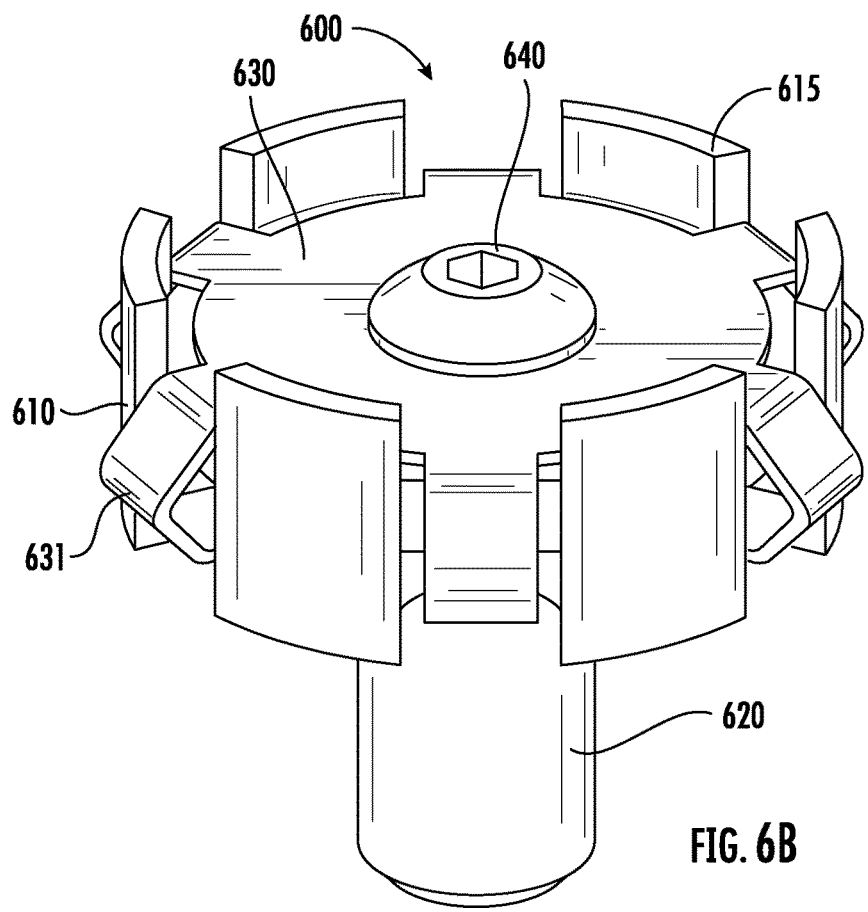

FIGS. 6A-6B show an embodiment that utilizes a different fastener. FIG. 6A shows a cross-sectional view of the mounting hardware installed in the pedestal 50, while FIG. 6B shows a perspective view of the fastener.

The fastener 600 includes a head 610 and a shaft 620. In some embodiments, the outer surface of the shaft 620 may be threaded to secure the fastener 600 to the pedestal 50. In other embodiments, the shaft 620 is press fit into the holes 52 of the pedestal 50. The head 610 rests on the shaft 620 and includes a threaded hole 611 on its top surface. This threaded hole 611 may be concentric with the shaft 620. In some embodiments, the head 610 may also include several upward protrusions 615, which are spaced apart along the outer perimeter of the head 610.

A compliant component 630 is affixed to the head 610 using a screw 640 that passes through the threaded hole 611. The compliant component 630 may be a metal sheet that is formed with a plurality of radially extending spokes 631, which may be bent with at least one joint. In the embodiment shown in FIG. 6A, the spokes 631 are bent and have three joints, such that the distal end of each spoke 631 is disposed directly beneath a portion of that spoke 631. In some embodiments, the bend at each joint may be 60°. In FIG. 6A, the total bending angle of the spoke 631 is 180°, although other angles of bending may be used. In embodiments where the head 610 includes the upward protrusions 615, the spokes 631 each extend between adjacent upward protrusions 615.

While FIGS. 6A-6B show the mounting hardware as having several separate parts, it is understood that in another embodiment, this the mounting hardware may be constructed as a single machined or formed part.

As illustrated in FIG. 6A, the fastener 600 may be utilized with the shield ring 60 shown in FIG. 4B, which has an indentation 67 and/or an inward protrusion 68. Alternatively, the fastener 600 may be utilized with the shield ring of FIG. 4A, which has smooth interior walls 66.

During installation, the fastener 600 is secured to the pedestal 50. The compliant component 630 may be attached to the head 610 of the fastener 600 before or after it has been secured to the pedestal 50 by inserting a screw 640 in threaded hole 611. The shield ring 60 is then pressed onto the fasteners 600 such that each fastener 600 enters a respective bore 63 in the shield ring 60. The spokes 631 of the compliant component 630 bend to allow the shield ring 60 to be pressed into the fastener 600. The outward force of the spokes 631 retains the shield ring 60 in place. Because the compliant component is metal, electrical conductivity and thermal conductivity exists between the shield ring 60, the fastener 600 and the pedestal 50.

Thus, all of these embodiments utilize a shield ring 60, which is a solid annular ring, has no fastening openings on its top surface 61 and includes a plurality of bores 63 on its bottom surface 62. The bores 63 may have smooth interior walls 66, or may be interior walls 66 that include an indentation 67. Further, all of these embodiments include a fastener which is secured to a hole 52 in the pedestal 50. The fasteners include a compliant component attached thereto. This compliant component may be an O-ring, a spiral wound shield gasket or a component that has a plurality of bent spokes. During installation, the bores 63 are aligned with the fasteners, which were previously secured to the pedestal 50. The shield ring 60 is then pressed down, and the compliant component serves to retain the shield ring 60 in place. In some embodiments, a shield ring insert is disposed between the compliant component and the interior walls 66 of the bore 63.

While the present disclosure describes the use of this shield ring in a PLAD system 10, it is understood that this mounting hardware may be employed in any system that utilizes a shield ring.

The embodiments described above in the present application may have many advantages. Currently, shield rings are attached to the pedestal using screws that pass through holes in the top surface of the shield ring. Caps are then placed over the screws to protect the screws. However, the caps introduce issues by creating crevices that can trap particles or deposition or cause process non-uniformity. Additionally, as the caps become worn through usage, they may become dislodged, causing workpiece handling errors. The present system eliminates the need for these exposed screws and caps. By using fasteners with a compliant component and a shield ring with bores in its bottom surface, the fasteners are completely hidden by the shield ring. This eliminates the issues associated with the prior art.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A plasma doping system, comprising:
a plasma chamber;
a pedestal disposed in the plasma chamber having a plurality of holes;
a platen disposed on the pedestal;
a shield ring surrounding the platen, wherein a bottom surface of the shield ring comprises a plurality of bores; and
a plurality of fasteners, each secured to a respective one of the plurality of holes in the pedestal and each including a compliant component;

wherein each of the plurality of fasteners is disposed within a respective one of the plurality of bores in the shield ring.

2. The plasma doping system of claim 1, wherein the compliant component is electrically conductive.

3. The plasma doping system of claim 1, wherein the compliant component is in contact with the shield ring.

4. The plasma doping system of claim 1, wherein the plurality of fasteners each comprises a head and a shaft, and wherein the head comprises a radial recess, and wherein the compliant component is disposed in the radial recess.

5. The plasma doping system of claim 4, wherein the compliant component is an O-ring or a spiral wound shield gasket.

6. The plasma doping system of claim 1, further comprising a shield ring insert disposed in a respective one of the plurality of bores, wherein an outer surface of the shield ring insert is in contact with interior walls of the respective one of the plurality of bores and wherein the compliant component is in contact with an inner surface of the shield ring insert.

7. The plasma doping system of claim 1, wherein the plurality of fasteners each comprises a head and a shaft, and wherein an outer surface of the shaft is threaded and wherein the plurality of holes in the pedestal are threaded.

8. The plasma doping system of claim 1, wherein interior walls of the plurality of bores are smooth.

9. The plasma doping system of claim 1, wherein interior walls of the plurality of bores comprise an indentation that corresponds to a location of the compliant component.

10. The plasma doping wherein the compliant component comprises sheet metal comprising a plurality of spokes, wherein each spoke is bent at at least one joint.

11. The plasma doping system of claim 1, wherein each bore is formed with an indentation such that a diameter of the bore at a bottom surface is smaller than a diameter of the bore at at least one other location.

12. An assembly for use on a pedestal in a plasma doping chamber comprising:
   a shield ring shaped as an annular ring, wherein a bottom surface of the shield ring comprises a plurality of bores; and
   a plurality of fasteners, each having a head and a shaft, wherein the shaft is adapted to be secured to the pedestal, and wherein the head is configured to hold a compliant component;
   wherein each of the plurality of fasteners is disposed within a respective one of the plurality of bores in the shield ring, such that each compliant component is compressed in a respective one of the plurality of bores.

13. The assembly of claim 12, wherein the head comprises a radial recess and the compliant component is disposed in the radial recess.

14. The assembly of claim 13, wherein the compliant component is an O-ring or a spiral wound shield gasket.

15. The assembly of claim 12, wherein the compliant component is in contact with interior walls of the respective one of the plurality of bores.

16. The assembly of claim 12, further comprising a shield ring insert disposed in a respective one of the plurality of bores, wherein an outer surface of the shield ring insert is in contact with interior walls of the respective one of the plurality of bores and wherein the compliant component is in contact with an inner surface of the shield ring insert.

17. The assembly of claim 12, wherein the compliant component comprises sheet metal comprising a plurality of spokes, wherein each spoke is bent at at least one joint.

18. The assembly of claim 12, wherein each bore is formed with an indentation such that a diameter of the bore at a bottom surface is smaller than a diameter of the bore at at least one other location.

* * * * *